United States Patent
Sakuragi et al.

(10) Patent No.: US 12,313,715 B2
(45) Date of Patent: May 27, 2025

(54) MAGNETIC RESONANCE IMAGING APPARATUS AND CONTROL PROGRAM FOR MAGNETIC RESONANCE IMAGING APPARATUS

(71) Applicant: FUJIFILM Corporation, Tokyo (JP)

(72) Inventors: Kenta Sakuragi, Tokyo (JP); Shinji Takahashi, Tokyo (JP); Kentaroh Sunaga, Tokyo (JP); Chikako Moriwake, Tokyo (JP); Hisako Nagao, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/722,947

(22) Filed: Dec. 20, 2019

(65) Prior Publication Data
US 2020/0271742 A1 Aug. 27, 2020

(30) Foreign Application Priority Data
Feb. 26, 2019 (JP) .................................. 2019-032865

(51) Int. Cl.
G01R 33/54 (2006.01)
G06F 3/0482 (2013.01)
G06F 3/04847 (2022.01)

(52) U.S. Cl.
CPC ......... G01R 33/546 (2013.01); G01R 33/543 (2013.01); G06F 3/0482 (2013.01); G06F 3/04847 (2013.01)

(58) Field of Classification Search
None
See application file for complete search history.

(56) References Cited

U.S. PATENT DOCUMENTS 6,904,161 B1 * 6/2005 Becker ................ G01S 7/52098
382/128
2007/0214017 A1 * 9/2007 Profio .................... G16H 40/63
705/3

(Continued)

FOREIGN PATENT DOCUMENTS

JP 2004-194729 A 7/2004
JP 2010-082025 A 4/2010

(Continued)

OTHER PUBLICATIONS

Hitachi. (Jun. 2016). 5.0 Oasis Basic How-To Manual. Retrieved from https://hca.fujifilm.com/sites/default/files/downloads/5.0%20Oasis%20Basic%20How-To%20Manual_complete.pdf (Year: 2016).*

(Continued)

Primary Examiner — Linda Huynh
(74) Attorney, Agent, or Firm — Foley & Lardner LLP (57) ABSTRACT

Automatically performing a serial examination flow including, for example, positioning, imaging, and post processing enables reducing a burden placed on the user by a manual operation and improving examination efficiency. A magnetic resonance imaging apparatus includes a computation unit that performs action control of the entire apparatus and computation and an imaging unit that performs imaging according to control performed by the computation unit, wherein the computation unit includes a storage unit that stores a plurality of examination flow data each defining a processing flow of at least one of imaging processing, post processing, display processing, and transfer processing, and stores a plurality of keywords respectively indicating contents of at least a part of the examination flow data, an input unit that receives an input instruction issued by a user for executing a desired examination, and an examination flow control unit that selects the examination flow data corre- (Continued)

sponding to the input instruction and causes processing defined by the selected examination flow data to be performed.

6 Claims, 10 Drawing Sheets

(56) References Cited

U.S. PATENT DOCUMENTS

| | | | | |
|---|---|---|---|---|
| 2010/0293500 | A1* | 11/2010 | Cragun | G06F 3/0485 |
| | | | | 715/863 |
| 2012/0283549 | A1* | 11/2012 | Miyazaki | G01R 33/543 |
| | | | | 600/413 |
| 2013/0106905 | A1 | 5/2013 | Sunaga | |
| 2013/0211240 | A1* | 8/2013 | Kitane | G01R 33/546 |
| | | | | 600/420 |
| 2014/0037160 | A1* | 2/2014 | Matsuzaki | G06T 7/0012 |
| | | | | 382/128 |
| 2014/0098933 | A1* | 4/2014 | Profio | A61B 6/465 |
| | | | | 378/19 |
| 2014/0104311 | A1* | 4/2014 | Park | A61B 6/461 |
| | | | | 345/629 |
| 2014/0111199 | A1* | 4/2014 | Oh | A61B 5/055 |
| | | | | 324/309 |
| 2014/0132268 | A1 | 5/2014 | Nagao | |
| 2015/0272703 | A1* | 10/2015 | Arima | A61B 6/548 |
| | | | | 378/62 |
| 2016/0054416 | A1* | 2/2016 | Stehning | G06F 18/24 |
| | | | | 600/411 |
| 2016/0128606 | A1* | 5/2016 | Sakuragi | A61B 5/055 |
| | | | | 600/415 |
| 2016/0133012 | A1* | 5/2016 | Miyazawa | G06T 7/0012 |
| | | | | 382/132 |
| 2016/0139217 | A1* | 5/2016 | Sakuragi | G01R 33/546 |
| | | | | 600/415 |
| 2016/0213347 | A1* | 7/2016 | Kawanishi | A61B 6/465 |
| 2017/0046482 | A1* | 2/2017 | Kuo | G01R 33/546 |
| 2017/0163869 | A1* | 6/2017 | Semba | A61B 6/465 |
| 2017/0265829 | A1* | 9/2017 | Adam | A61B 6/501 |
| 2019/0231297 | A1* | 8/2019 | Takekoshi | A61B 6/54 |

FOREIGN PATENT DOCUMENTS

| | | |
|---|---|---|
| JP | 2014-083435 A | 5/2014 |
| JP | 5738193 B2 | 6/2015 |
| JP | 5819300 B2 | 11/2015 |
| JP | 5960136 B2 | 8/2016 |
| WO | WO-2015/198680 A1 | 12/2015 |

OTHER PUBLICATIONS

Merriam-Webster. Automatic. Retrieved Jan. 9, 2023 from https://www.merriam-webster.com/dictionary/automatic (Year: 2022).*

Office Action issued in corresponding JP Application No. 2019-032865 dated Jun. 28, 2022 (6 pages).

Office Action issued in corresponding Japanese Patent Application No. 2019-032865 dated Dec. 6, 2022 with English translation (6 pages).

* cited by examiner

MAGNETIC RESONANCE IMAGING APPARATUS AND CONTROL PROGRAM FOR MAGNETIC RESONANCE IMAGING APPARATUS

INCORPORATION BY REFERENCE

The present application claims priority from Japanese patent application JP-2019-032865 filed on Feb. 26, 2019, the content of which is hereby incorporated by reference into this application.

BACKGROUND OF THE INVENTION

Field of the Invention

The present invention relates to a magnetic resonance imaging apparatus and a control program therefor.

Description of the Related Art

A magnetic resonance imaging (hereinafter referred to as "MRI") apparatus is an apparatus which measures a nuclear magnetic resonance (hereinafter referred to as "NMR" or "echo") signal generated by nuclear spins configuring an object under examination, particularly, an organ in the human body and performs two-dimensional or three-dimensional imaging of the form or function of, for example, the head region, abdominal region, or extremities of the human body.

While, in examinations using an MRI apparatus, imaging is usually performed on an anatomically determined imaging plane for every examination object region, the body shape of an object under examination or the posture thereof on the bed varies for every examination. Therefore, even in the case of performing similar imaging sequences or in the case of performing similar post processing operations, during each examination, cumbersome and complicated operations which are manually performed by the user, such as setting and adjusting the imaging position of an object under examination or removing a background signal used for three-dimensional (3D) analysis, are required. Furthermore, these manual operations may become required for every imaging type or every post processing operation, thus placing a large burden on the user.

To reduce the burden on the user, for example, Japanese Patent No. 5,960,136 discloses an imaging position setting assistive technique which, even in the case of an examination region in which there is a plurality of imaging planes to be examined, automatically sets imaging positions also including selecting imaging planes to be imaged and performing adjustment such as determination to increase or decrease the number of imaging slices. Moreover, Japanese Patent No. 5,819,300 discloses a technique which automatically calculates an appropriate imaging position from a dedicated positioning image.

On the other hand, Japanese Patent No. 5,738,193 discloses a technique which supports an operation for background signal removal when 3D analysis is performed based on images acquired by the MRI apparatus.

However, the above-mentioned Japanese Patent No. 5,960,136, Japanese Patent No. 5,819,300 and Japanese Patent No. 5,738,193 merely realize automatization individually about the limited processing operations such as positioning and removal of a background signal. Accordingly, not all of the processing operations included in a serial examination such as, starting with positioning, inputting of a scan condition, desired imaging, and 3D analysis for an image acquired by an imaging operation are automatized, so that some manual operations are inevitable. Usually, in examinations using an MRI apparatus, the user has to perform not only image generation and confirmation for diagnosis but also, for example, monitoring of the physical condition or shape of a subject. Accordingly, besides this, there is such an inconvenience that, if a manual operation is performed for every processing operation included in an examination, the examination efficiency decreases.

SUMMARY OF THE INVENTION

In response to the above-mentioned issue, aspects of the present invention are directed to automatically performing a serial examination flow including, for example, positioning, imaging, and post processing, thus reducing a burden on the user placed by a manual operation and increasing the examination efficiency.

According to an aspect of the present invention, a magnetic resonance imaging apparatus includes a computation unit that performs computation and action control of the entire apparatus and an imaging unit that performs imaging according to control of the computation unit, wherein the computation unit includes a storage unit that stores a plurality of examination flow data, each defining a processing flow of at least one of imaging processing, post processing, display processing, and transfer processing, and stores keywords respectively identifying the examination flow data, a user interface unit that receives an input instruction issued by a user for executing a desired examination, and an examination flow control unit that selects the examination flow data corresponding to the input instruction and causes processing defined by the selected examination flow data to be performed.

Moreover, according to another aspect of the present invention, a control program for a magnetic resonance imaging apparatus including a computation unit that performs computation and action control of the entire apparatus, an imaging unit that performs imaging according to control of the computation unit, and a storage unit that stores a plurality of examination flow data, each defining a processing flow of at least one of imaging processing, post processing, display processing, and transfer processing, and stores keywords respectively identifying the examination flow data, causes a computer to perform a step of receiving an input instruction issued by a user for executing a desired examination, and a step of selecting the examination flow data corresponding to the input instruction and causing processing defined by the selected examination flow data to be performed.

The keywords stored in the storage unit are defined as "ordering keywords for examination", hereinafter.

According to an embodiment of the present invention, a serial examination flow including, for example, positioning, imaging, and post processing is automatically performed, so that a burden on the user placed by a manual operation can be reduced and the examination efficiency can be increased.

DESCRIPTION OF THE EMBODIMENTS

Hereinafter, an MRI apparatus according to an embodiment of the present invention is described with reference to the drawings.

Figure 1:
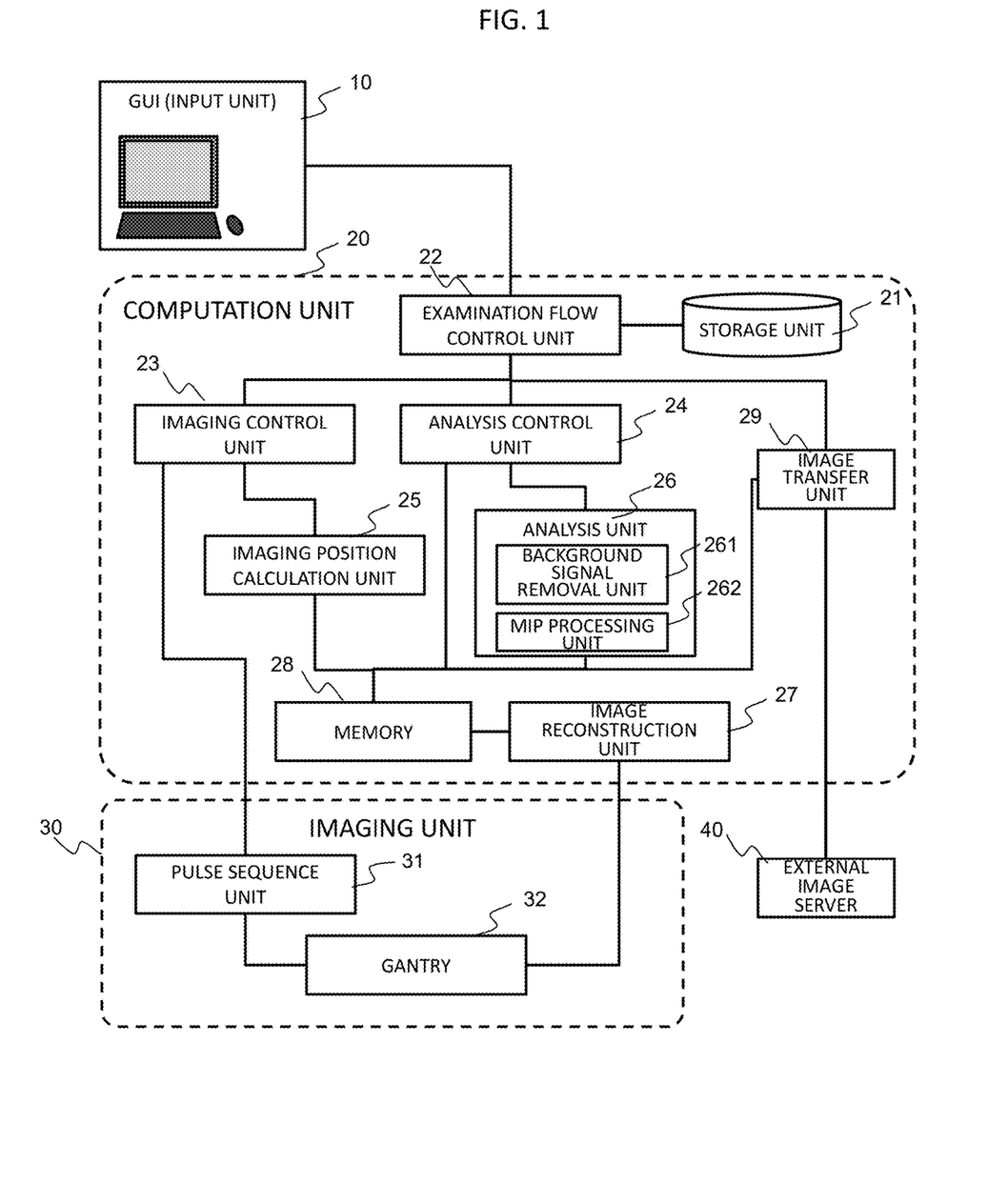
FIG. 1 is a block diagram illustrating an outline configuration of an MRI apparatus according to an embodiment of the present invention.

As illustrated in FIG. 1, the MRI apparatus includes a GUI (user interface unit) 10, a computation unit 20, and an imaging unit 30.

The GUI 10 is a unit which receives various input instructions issued by the user, including, for example, a scan condition and setting for executing examinations, outputs the input instructions to the computation unit 20, and displays, to the user, for example, results of imaging and input screens needed for instructions, and includes, for example, a display device and an input device, which are not illustrated. For example, the GUI 10 causes a display unit (not illustrated) to display an input screen such as that illustrated in FIG. 2, thus enabling the user to issue an input instruction.

To cause an examination configured with a plurality of processing operations to be automatically executed from the start of the examination to the end thereof, the computation unit 20 includes a storage unit 21, which stores required data, an examination flow control unit 22, an imaging control unit 23, an analysis control unit 24, an imaging position calculation unit 25, an analysis unit (background signal removal unit) 26, an image reconstruction unit 27, a memory 28, and an image transfer unit 29.

The imaging position calculation unit 25, which is loaded with an automatic positioning algorithm disclosed in, for example, Japanese Patent No. 5,819,300, extracts anatomical feature points in a positioning image, and automatically calculates an appropriate imaging position from the extracted feature points. The background signal removal unit, which is loaded with an automatic algorithm of removing background signal disclosed in, for example, Japanese Patent No. 5,738,193, extracts contours other than a background and generates an image with the background removed therefrom.

Each unit other than the storage unit 21 and the memory 28 of the computation unit 20 can be configured with a central processing unit (CPU), a graphics processing unit (GPU), or a combination of the two units. Moreover, a part or the whole of an action which each unit other than the storage unit 21 and the memory 28 of the computation unit 20 performs can be implemented by an application specific integrated circuit (ASIC) or a field-programmable gate array (FPGA).

Figure 3:
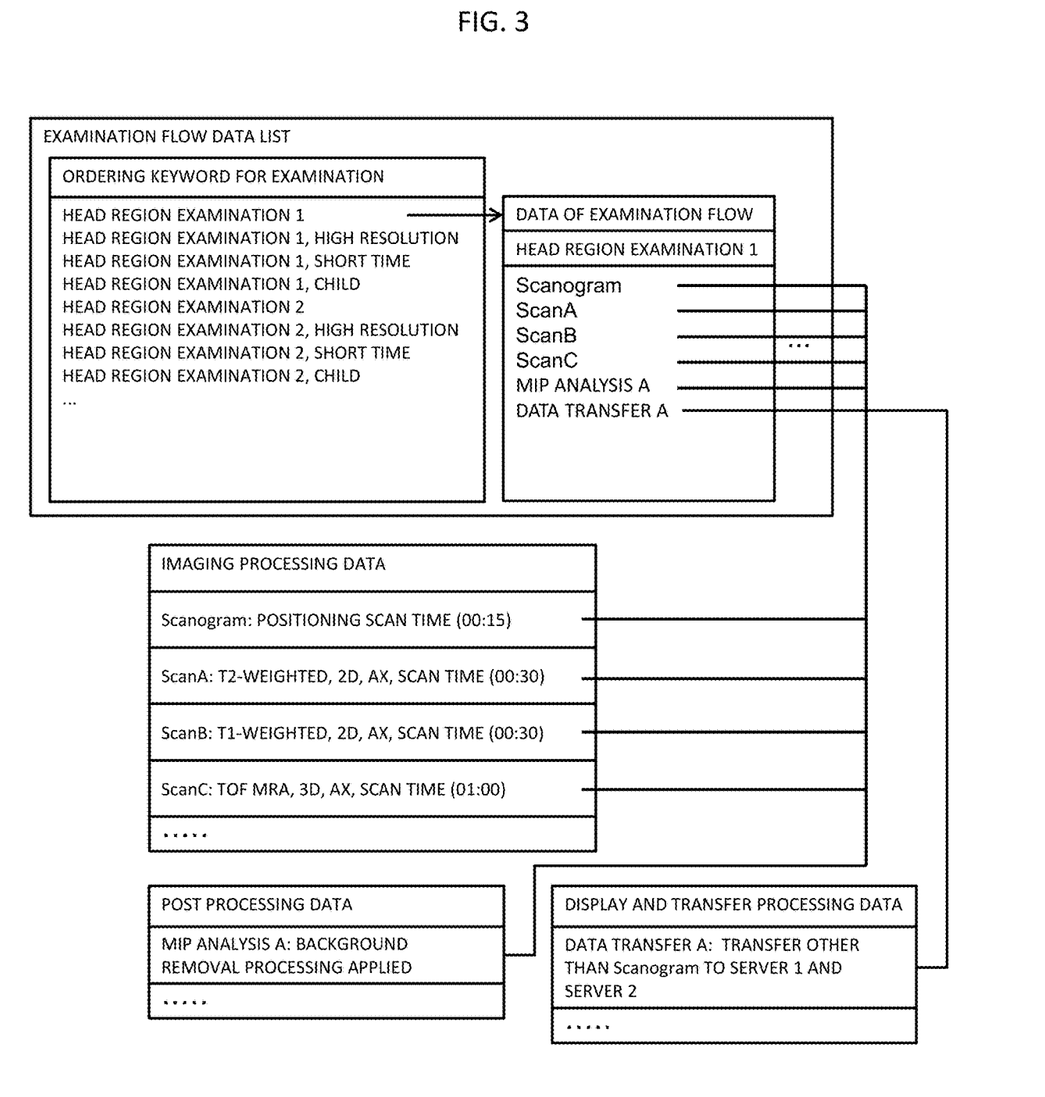
FIG. 3 is a reference diagram illustrating an example of data of examination flow list stored in a storage unit of the MRI apparatus illustrated in FIG. 1.

The storage unit 21 stores a plurality of examination flow data each defining at least one of imaging processing, post processing, display processing, and transfer processing, and stores a plurality of keywords respectively identifying the examination flow data (ordering keywords for examination). FIG. 3 illustrates a specific example about the examination flow data and the keywords in the storage unit 21.

In the example illustrated in FIG. 3, a plurality of examination flow data is stored as an examination flow data list together with ordering keywords for examination. Each ordering keyword for examination indicates an examination which the user desires, which is previously defined by combining, as a set, an examination region and a simple keyword regarding, for example, an examination object or an imaging time, and, in the example illustrated in FIG. 3, for example, "head region examination 1, high resolution", "head region examination 1, short time", and "head region examination 1, child" are preset.

As processing operations included in head region examination 1, which is a specific example of data of examination flow, Scanogram, ScanA, ScanB, ScanC, MIP analysis A, and data transfer A are stored. Scanogram is a low-resolution imaging operation for acquiring a positioning image, and ScanA, ScanB, and ScanC are respective imaging operations performed by various imaging techniques, and are, for example, T1-weighted imaging, T2-weighted imaging, diffusion-weighted imaging, and fat-suppressed imaging. MIP analysis is a projection processing technique for an image acquired by 3D imaging. The storage unit 21 previously stores a plurality of examination flow data such as those described above.

The storage unit 21 further stores specific contents of the respective processing operations included in head region examination 1 as imaging processing data, post processing data, and display and transfer processing data. For example, the imaging processing data includes, for example, recommended imaging parameters (for example, TE, TR, number of times of addition, and imaging speed rate) in a predetermined imaging method and information about an imaging cross-section. The post processing data includes, for example, data about threshold values and initial values required for execution of an analysis algorithm and information about the type of analysis data to be generated and the type of analysis image.

The display and transfer processing data includes, for example, information about a frame division or enlargement factor of a display and a transfer destination and information about an image type to be displayed and transferred. Specifically, the display and transfer processing data is data about the processing contents of, for example, "data transfer A: processing for transferring other than Scanogram to server 1 and server 2" and "data transfer B: processing for transferring an image obtained by ScanA and ScanB to server 1".

Such data of examination flow and imaging processing data which are stored in the storage unit 21 are able to be subjected to alteration or addition by the user via the GUI 10. Moreover, specific contents of the processing which was used in a past examination are previously stored together with information for identifying the past examination.

The examination flow control unit 22 selects, according to an input instruction by the user received by the GUI 10, data of examination flow corresponding to the input instruction from the examination flow data list stored in the storage unit 21. Then, to cause the respective processing operations defined by the selected examination flow data to be performed, the examination flow control unit 22 transmits, to the imaging control unit 23, the analysis control unit 24, and the image transfer unit 29, control signals for causing these units to operate.

The imaging control unit 23 controls imaging processing described below, which is performed by the imaging unit 30, according to a control signal transmitted from the examination flow control unit 22. In a case where the imaging processing is a positioning scan, the imaging control unit 23 transmits, to the imaging position calculation unit 25, a control signal for automatically calculating an imaging position based on an image acquired by imaging using the positioning scan.

The analysis control unit 24 performs control of post processing according to a control signal transmitted from the examination flow control unit 22 in such a manner that the analysis unit 26 performs post processing of a reconstructed image generated by the image reconstruction unit 27 described below from an image acquired by an imaging operation of the imaging unit 30. The post processing which the analysis unit 26 performs includes various analyses such as numerical calculation using an image and statistical processing, and produces, as analysis results, for example, analysis result data and analysis result images.

In the present embodiment, the post processing which the analysis unit 26 performs includes maximum intensity projection (MIP) processing using 3D image data and background signal removal processing therefor, and the analysis unit 26 includes a background signal removal unit 261 and an MIP processing unit 262. Accordingly, the analysis control unit 24 outputs respective control signals to the background signal removal unit 261 in the case of performing background signal removal processing and to the MIP processing unit 262 in the case of performing MIP processing.

The imaging unit 30 includes at least a pulse sequence unit 31 and a gantry 32. The gantry 32 includes a magnetostatic field magnet (not illustrated), and further includes a gradient magnetic field generation coil, which generates a gradient magnetic field in a magnetostatic field space formed by the magnetostatic field magnet, a high-frequency magnetic field coil, which applies a high-frequency magnetic field (radio frequency (RF) pulses) to an object under examination placed in the magnetostatic field space, and a receiving high-frequency magnetic field coil, which receives a nuclear magnetic resonance signal (echo signal) generated from the object under examination.

Additionally, the imaging unit 30 further includes, although not illustrated, elements similar to those of a usual MRI apparatus, such as a transmission system, a gradient magnetic field generation system, and a reception system for driving the above-mentioned magnetic field generation coils.

The pulse sequence unit 31 transmits, according to a pulse sequence in which the timing and intensity of the high-frequency magnetic field, the gradient magnetic field, and the signal reception are described, various instructions required for data collection about a tomographic image of the object under examination in the gantry 32 to a transmission system which transmits RF pulses, a gradient magnetic field generation system which generates a gradient magnetic field, and a reception system which receives an echo signal.

The image reconstruction unit 27 generates a reconstructed image by reconstructing an image from an echo signal acquired by the imaging unit 30.

The memory 28 functions as a work area for the above-mentioned computations and processing operations of the respective units, and temporarily stores the generated image and the halfway progress of computation processing.

The image transfer unit 29 transfers the finally generated image to a display device (not illustrated) or an external image server 40 according to a control signal transmitted from the examination flow control unit 22.

With regard to the MRI apparatus configured in the above-described way, a procedure for automatically performing, in response to an input instruction from the user, an examination flow specified by the input instruction is described as follows.

First, creation of an examination flow data list, which is to be stored in the storage unit 21, is described. The examination flow data list includes, as illustrated in FIG. 3, a plurality of ordering keywords for examination, each of which is used to associate an examination flow and an input instruction with each other, and examination flow data, which is associated with each ordering keyword for examination. The ordering keyword for examination is specified by the user inputting an examination region and an examination order, which is described by a free expression (for example, a term or text expressing processing required for an examination), via a GUI screen such as that illustrated in FIG. 2.

The examination flow data is defined by the user, indicating a flow of processing corresponding to the ordering keyword for examination, and, for example, a predetermined flow of processing is previously set by default and can be subjected to alteration or addition by the user as appropriate. In the example illustrated in FIG. 2, "Scanogram", "ScanA", "ScanB", . . . are displayed as data of examination flow of head region examination 1. This indicates the contents of an examination included in head region examination 1, and the user is allowed to freely edit the contents, such as delete an unnecessary scan (imaging), transpose scans, or add another scan, while viewing such a display.

Additionally, with regard to processing, the user is allowed to set specific contents or conditions of processing for every processing. With regard to imaging processing, the user presets, via the GUI 10, for example, a scan time of "Scanogram" and specific contents of "Scan", for example, a scan condition (imaging parameter), such as a pulse sequence and an imaging cross-section, or a scan time. These contents or conditions are stored as imaging processing data in the storage unit 21. With regard to post processing too, the user is also allowed to set a rule of processing. For example, in the case of performing processing of a 3D image, the user is allowed to previously determine, for example, a sequence name or a field of view (FOV) region required for 3D processing.

Furthermore, after an examination is executed under a predetermined condition, an examination flow employed for the examination and the contents of each processing included in the examination are also stored in the storage unit 21 as imaging processing data or post processing data together with information for identifying the examination (for example, an order or keyword input by the user).

An automatic examination using the MRI apparatus is executed after thus setting (presetting) of the examination flow data list is performed by the user. Execution of an examination flow that is based on data of examination flow is performed according to, for example, a flowchart illustrated in FIG. 4.

Figure 4:
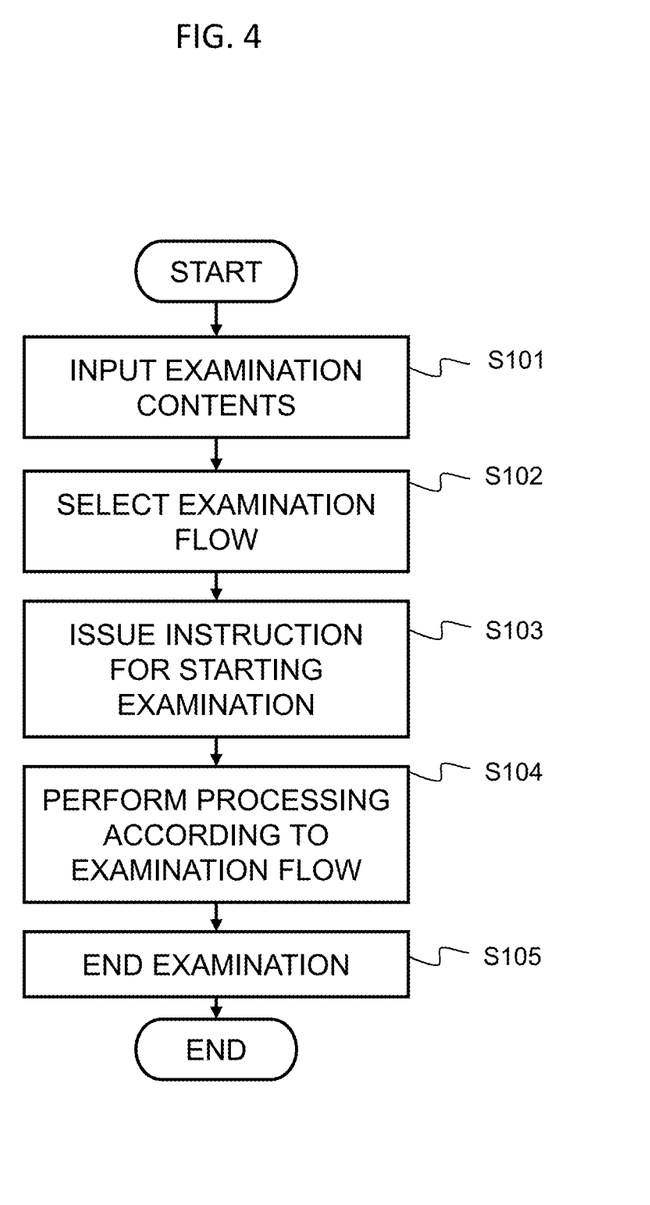
FIG. 4 is a flowchart illustrating the flow of processing performed in a case where an examination flow that is based on data of examination flow is performed in the MRI apparatus according to the embodiment of the present invention.

As illustrated in FIG. 4, in step S101, the user inputs subject information and examination contents via the GUI 10. Here, as indicated by the example of the GUI screen illustrated in FIG. 2, the subject information which the user inputs includes, for example, a subject identifier (ID), a subject name, an age, and a body weight, the examination contents include, for example, an examination region, an examination order, and an examination flow, and input blocks 201 to 203 used to input these examination contents are displayed.

The input block 202 for an examination order is used for the user to input, for example, a term or text for identifying an examination with a free expression. Moreover, although not illustrated in FIG. 2, in the case of performing the same examination as a past examination, a configuration in which the past examination is able to be identified based on, for example, an examination date thereof can be employed.

When, in this way, an examination region has been selected via the input block 201 and an examination order has been input via the input block 202, then in next step S102, the examination flow control unit 22 selects an ordering keyword for examination (FIG. 3) stored in the storage unit 21 based on these input instructions, and presents the selected keyword to the input block 203 for an examination flow.

Figure 2:
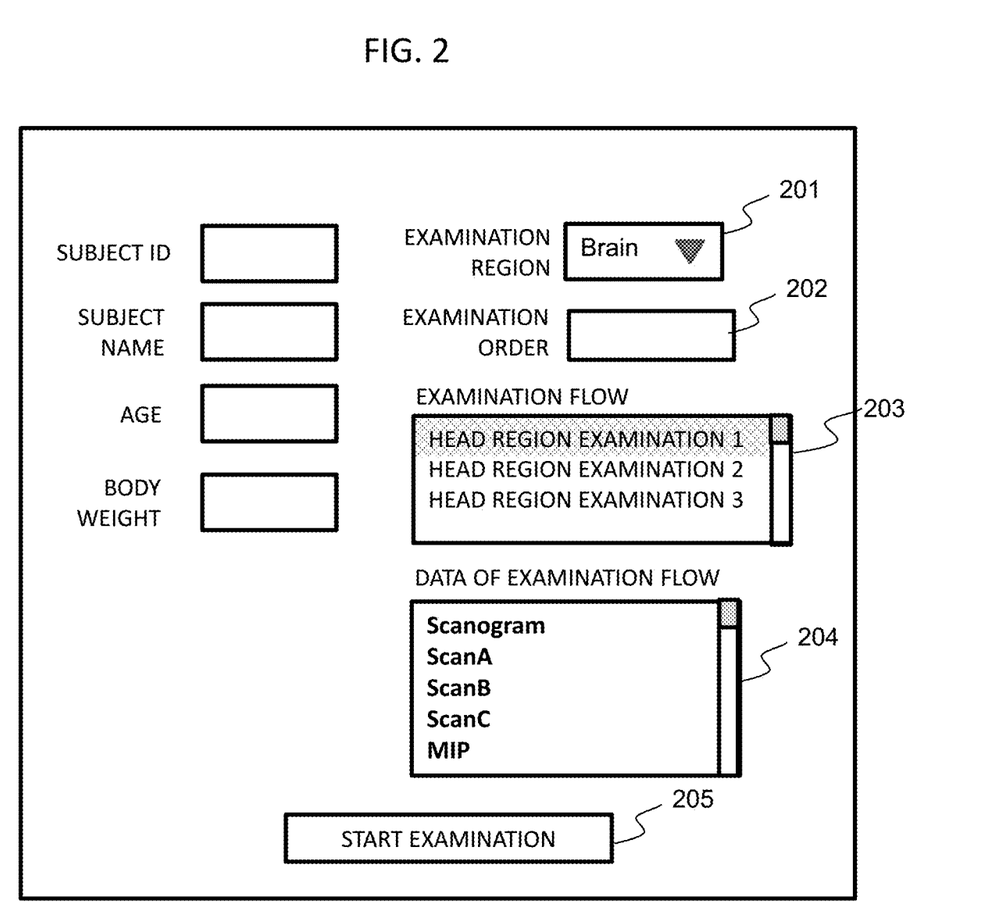
FIG. 2 is a reference diagram illustrating an example of a display screen of a graphical user interface (GUI) of the MRI apparatus illustrated in FIG. 1.

In the example illustrated in FIG. 2, a plurality of ordering keywords for examination selected based on the input instructions for an examination region and an examination order is displayed in the block 203, and the user is prompted to select a desired examination flow from the displayed keywords. Data of examination flow is specified by the examination region, the examination order, and the examination flow input in the above-described way and is then displayed in a block 204. In a case where an input instruction for specifying a past examination has been issued, data of examination flow the condition of which is the same as an examination condition of the past examination is called up.

Specifically, for example, in the screen illustrated in FIG. 2, when the user designates an examination region, examination flow data previously stored according to the examination region are displayed in the block 204, so that the user is allowed to select desired data of examination flow. Then, in a case where the user inputs data corresponding to data of examination flow of, for example, head region examination 1, head region examination 2, head region examination 3, . . . displayed in the block 203, the examination flow control unit 22 selects data of examination flow as input by the user.

In the example illustrated in FIG. 3, since head region examination 1 is selected as an order preset, head region examination 1 is selected as data of examination flow, and the contents of processing operations included in head region examination 1 are displayed in an examination flow data field (block 204) of the GUI 10. With the GUI 10, the user is able to check the contents of an examination which is to be executed. Furthermore, a configuration in which the user is allowed to alter the displayed data of examination flow can be employed.

When, in step S103, the user issues an examination starting instruction, to cause the processing operation defined by the examination flow data to be performed, the examination flow control unit 22 transmits, to the imaging control unit 23, the analysis control unit 24, and the image transfer unit 29, respective control signals for causing these units to operate. The imaging control unit 23, the analysis control unit 24, and the image transfer unit 29, which have received the control signals, perform the respective processing operations according to the control signals.

At this time, the imaging control unit 23 performs processing operations in order of the examination flow data list. More specifically, first, the imaging control unit 23 executes Scanogram to acquire a positioning image, performs control to pass the acquired positioning image data to the imaging position calculation unit 25, and performs control to cause the imaging position calculation unit 25 to calculate an imaging position corresponding to the examination flow data list.

Next, the imaging control unit 23 causes the GUI 10 to display a screen (for example, FIG. 5 and FIG. 6) indicating the positioning image data, the imaging position calculated by the imaging position calculation unit 25, calculation of the imaging position having normally ended, and the scan condition being within an acceptable range. In the examples illustrated in FIG. 5 and FIG. 6, the GUI 10 also displays a box 502 used to receive an instruction for "pause scan" from the user and a timer 503 for waiting for an instruction, thus enabling the user to pause a scan after viewing a displayed result.

If an instruction for "pause scan" is not issued within a set time (timer), the imaging control unit 23 performs control to cause the imaging unit 30 to start initial imaging (ScanA) with the calculated imaging position and the set scan condition.

Figure 5:
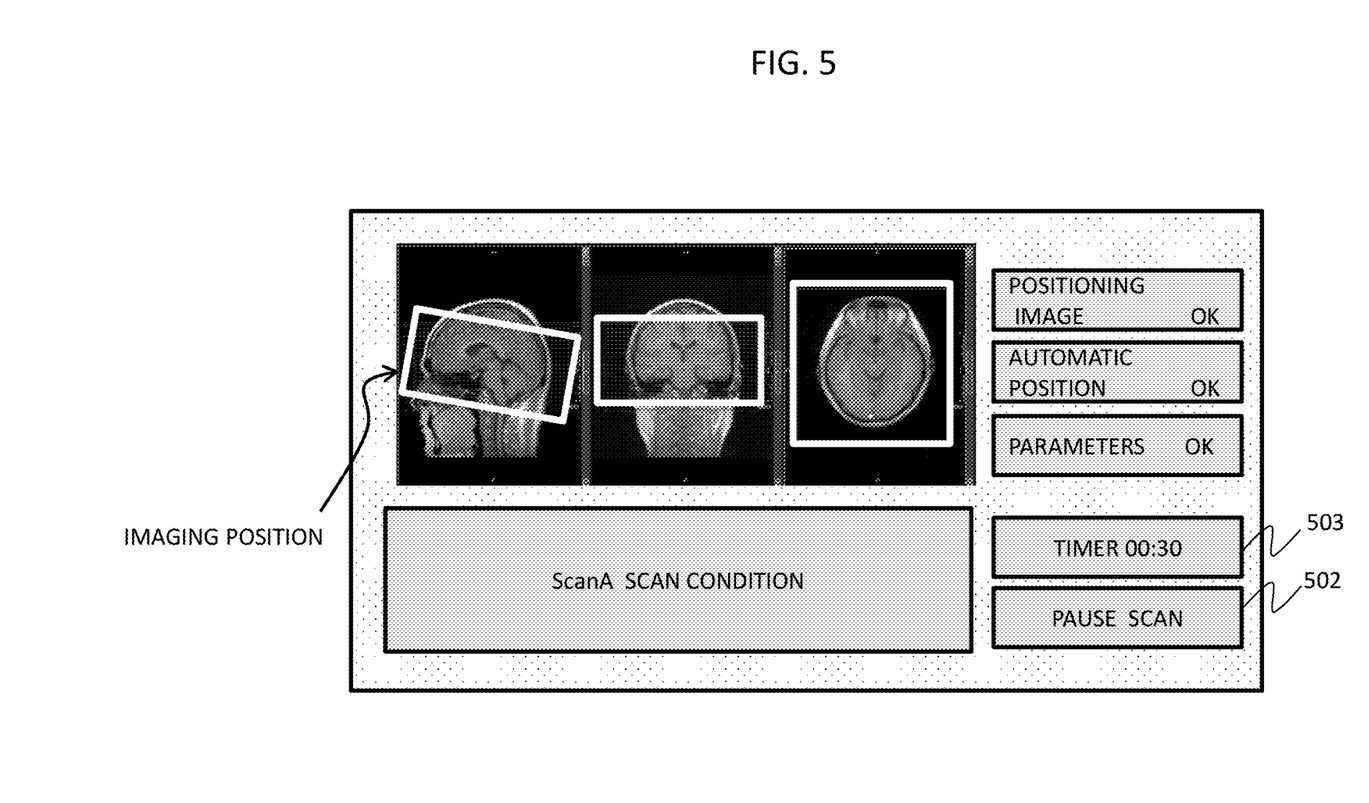
FIG. 5 is a reference diagram illustrating an example of a screen which is displayed on the GUI.
Figure 6:
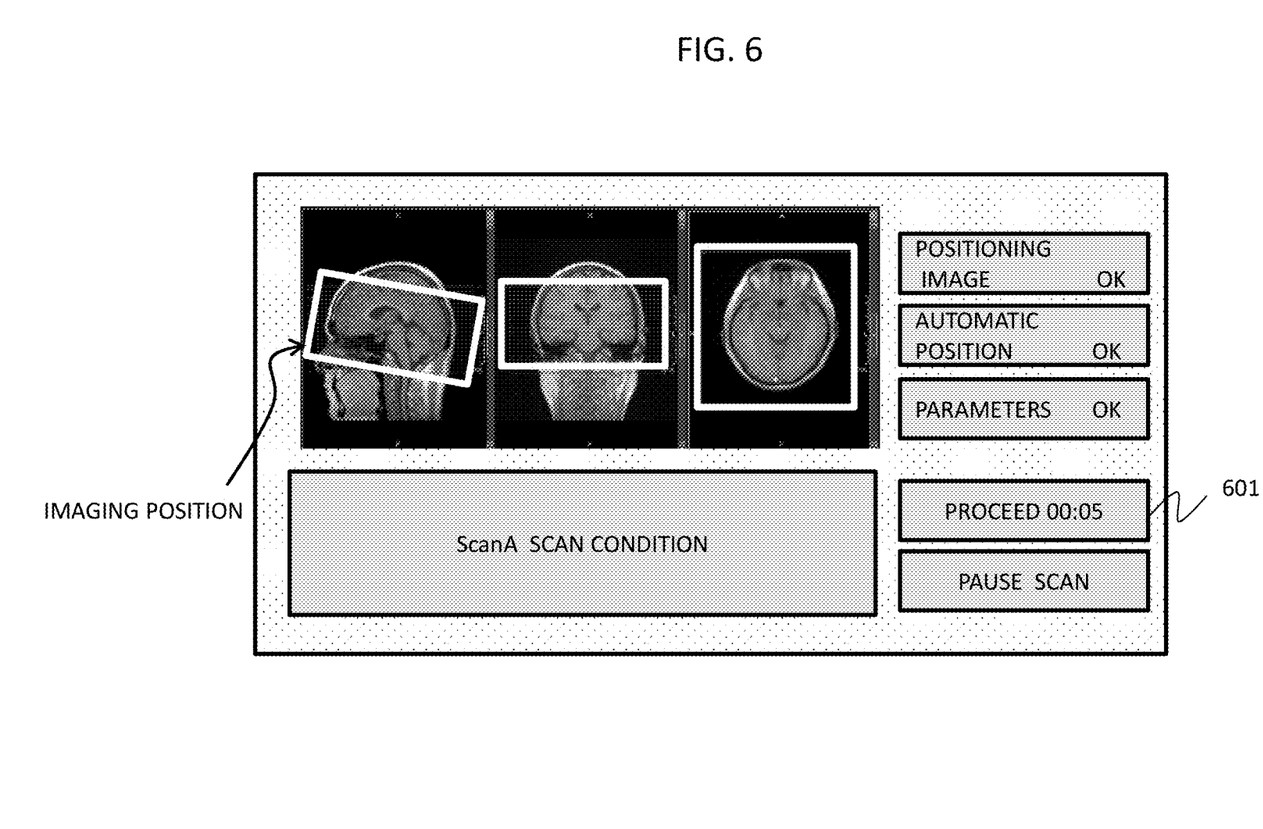
FIG. 6 is a reference diagram illustrating an example of a screen which is displayed on the GUI.

Moreover, in the examples illustrated in FIG. 5 and FIG. 6, the user is also able to manually change the imaging position and the scan condition after viewing a displayed result. In a case where the user has performed manual changing, a timer 601 which operates until the processing proceeds is displayed as illustrated in FIG. 6, and, unless "pause scan" or further manual changing is performed within the set time (timer), the imaging control unit 23 performs control to cause the imaging unit 30 to start initial imaging (ScanA) with the imaging position and the scan condition manually changed for the last time.

Furthermore, in a case where the user has performed manual changing, to provide a sufficient time for changing, countdown of the timer 601 can be stopped and, in the case of resuming the examination, an instruction for causing the examination to proceed can be issued.

Moreover, regardless of the presence or absence of manual changing, a box used to issue an instruction for "proceed" as well as the timer 601 can be previously displayed, and, without waiting for completion of countdown of the timer 601, the initial imaging (ScanA) can be started. The image reconstruction unit 27 reconstructs an image obtained with use of a signal acquired by the imaging unit 30 executing ScanA, and sends the reconstructed image to the memory 28.

Then, the imaging control unit 23 also automatically performs determination of an imaging position and setting of a scan condition similarly with respect to the second and subsequent imaging processing operations (for example, ScanB) of the examination flow data list, and causes the imaging unit 30 to automatically perform imaging processing in order of the data of examination flow.

Moreover, each time image data is generated by execution of imaging processing, the analysis control unit 24 checks whether the generated image data is data adapted for post processing data, and, when image data adapted for post processing (MIP analysis A) has been generated, the analysis control unit 24 causes the background signal removal unit 261 to perform background signal removal processing. In a case where the background signal removal processing has normally ended, the analysis control unit 24 causes the GUI 10 to display an image subjected to background signal removal (FIG. 7 and FIG. 8).

Figure 7:
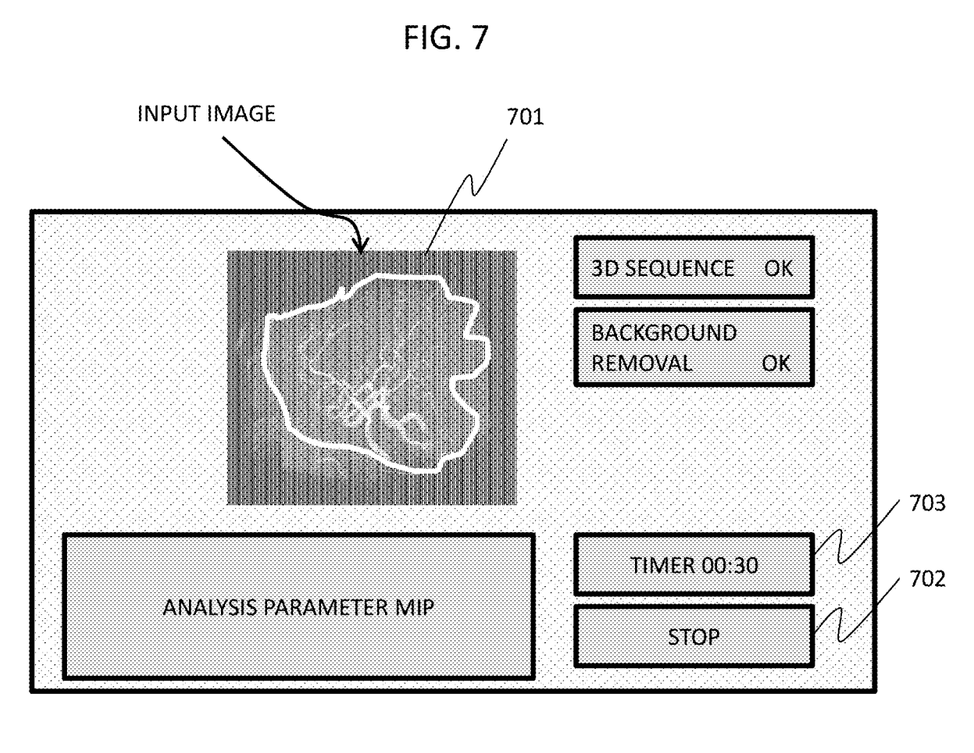
FIG. 7 is a reference diagram illustrating an example of a screen which is displayed on the GUI.

In this case, too, as illustrated in FIG. 7, a background signal removal processing result 701, which is to be checked by the user, as well as a block 702 used to issue an instruction for pausing analysis and a timer 703 indicating a waiting time can also be displayed. In a case where no instruction for pausing is issued within the time indicated by the timer 703, post processing (MIP) is automatically performed based on the background signal removal processing result 701.

Figure 8:
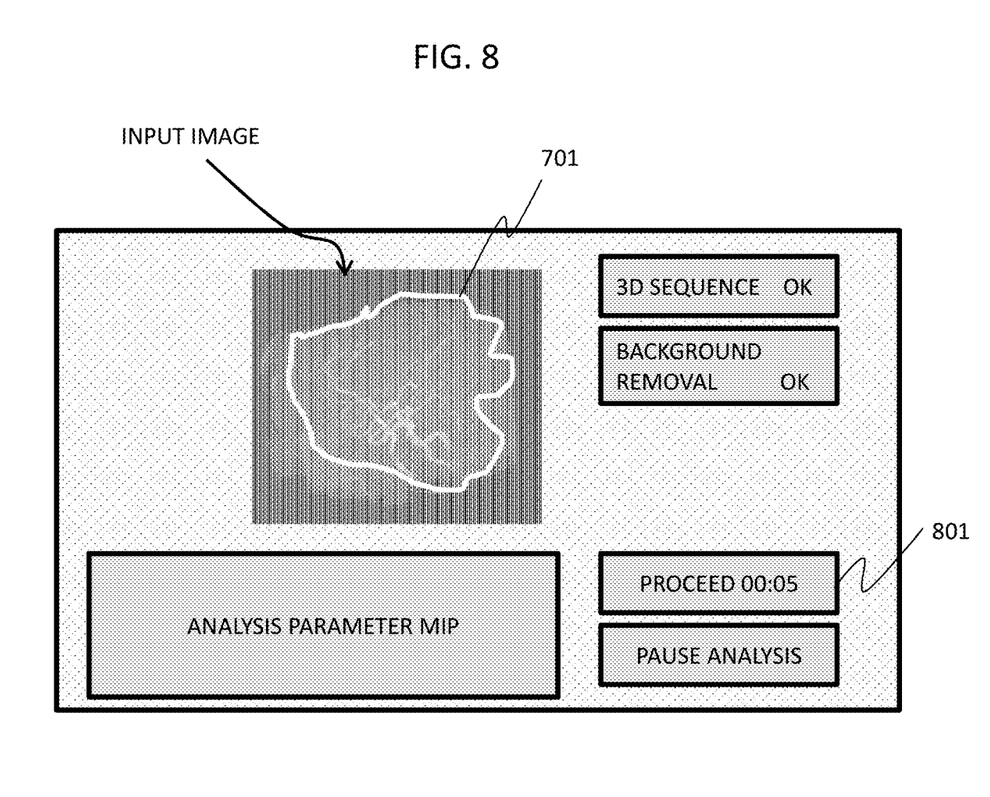
FIG. 8 is a reference diagram illustrating an example of a screen which is displayed on the GUI.

Moreover, in the examples illustrated in FIG. 7 and FIG. 8, after the calculation of an imaging position and the background signal removal are automatically performed by the MRI apparatus, the user is allowed to view the displayed background signal removal result and manually change or adjust background-removed portions or analysis parameters. In a case where the user has performed manual changing or manual adjusting, a timer 801 which operates until the processing proceeds is displayed as illustrated in FIG. 8, and, unless "pause analysis" or further manual changing is performed within the set time (timer), post processing (MIP) is automatically performed with the condition manually changed for the last time.

In a case where the user has performed manual changing, to provide a sufficient time for changing, countdown of the timer 801 can be stopped and, in the case of resuming the examination, an instruction for causing the examination to proceed can be issued. Moreover, a box used to issue an instruction for "proceed" as well as the timer 801 can be previously displayed, and, without waiting for completion of countdown of the timer 801, the post processing can be started.

Each time image data is generated by execution of imaging processing and post processing, the image transfer unit 29 checks whether the generated image data is image data targeted for transfer. In a case where the generated image data is image data targeted for transfer, the image transfer unit 29 automatically transfers the image data to a transfer destination.

Figure 9:
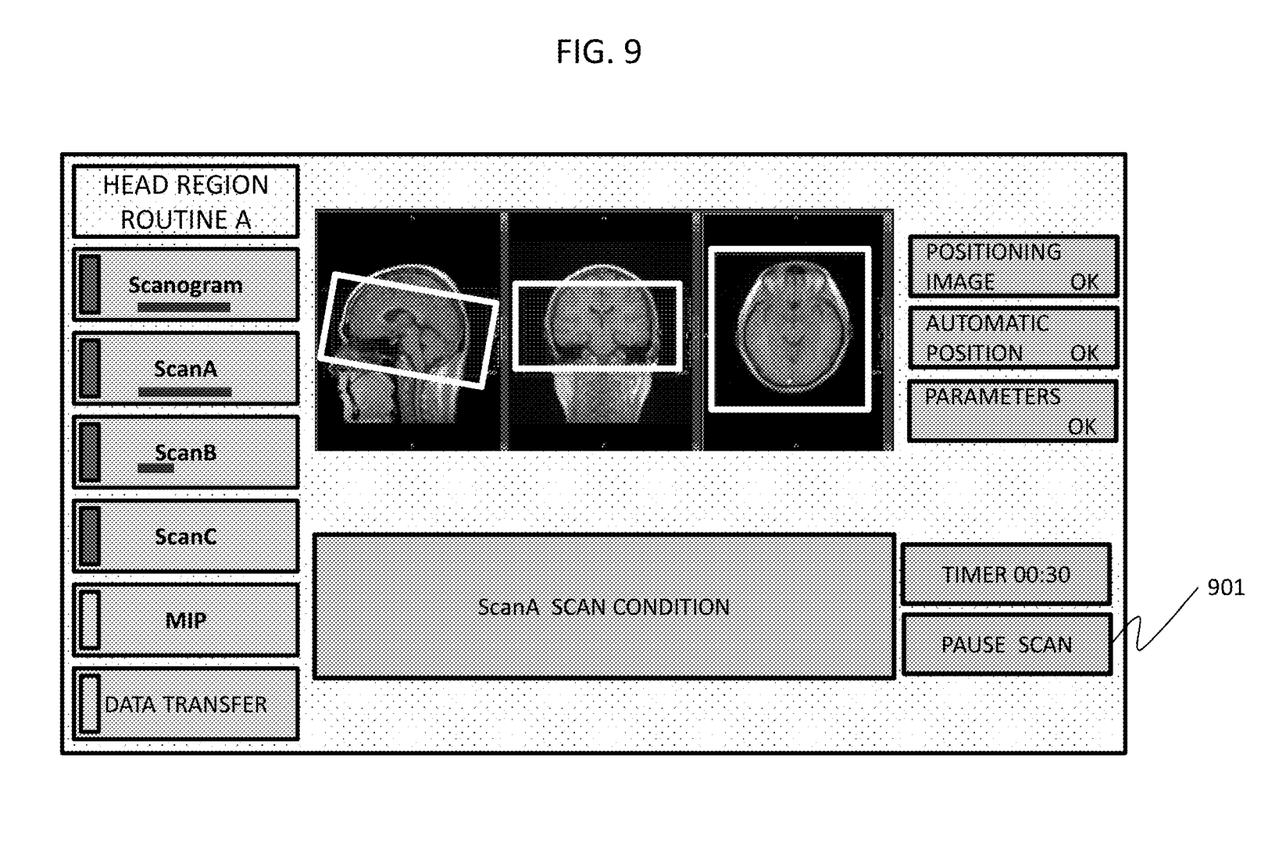
FIG. 9 is a reference diagram illustrating an example of a screen which is displayed on the GUI.
Figure 10:
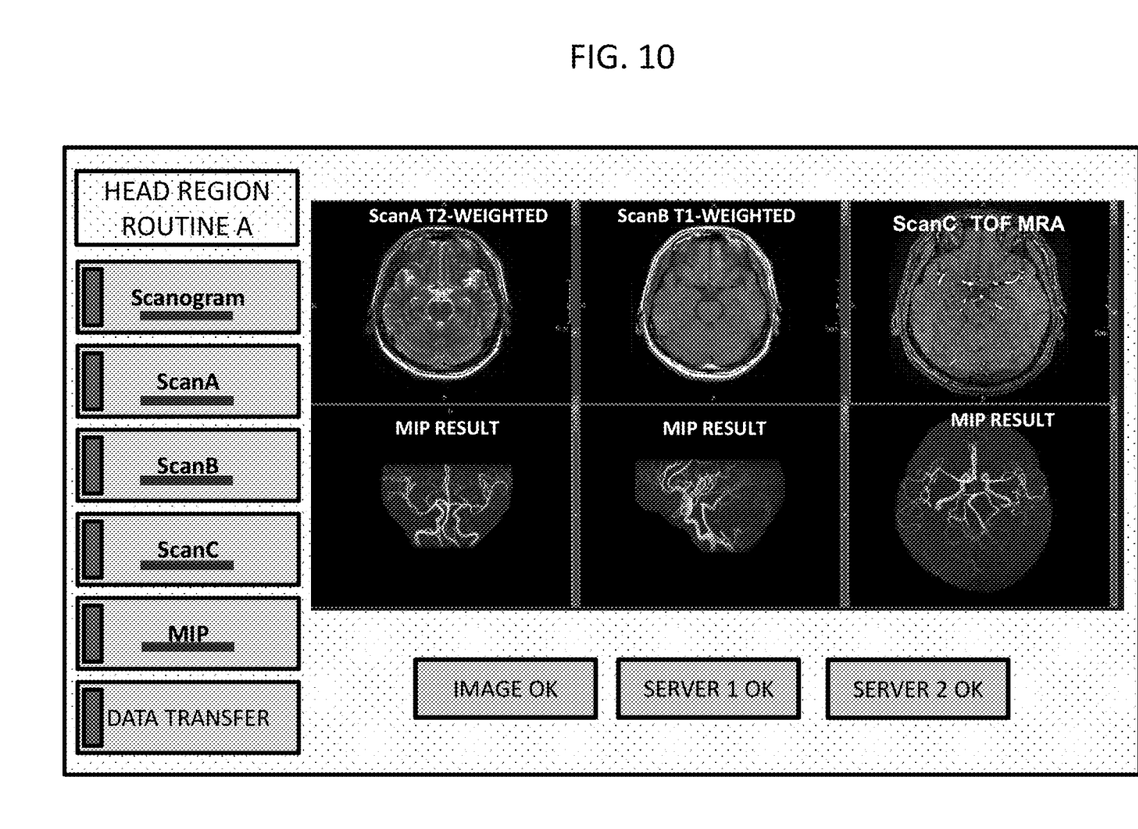
FIG. 10 is a reference diagram illustrating an example of a screen which is displayed on the GUI.

During execution of each processing operation, for example, the GUI 10 can be caused to display a screen such as that illustrated in FIG. 9 or FIG. 10. In the examples illustrated in FIG. 9 and FIG. 10, the processing operations included in the examination flow are enumerated on the left end side of the screen. Among the processing operations included in the examination flow illustrated in FIG. 9, automatic start processing for Scanogram, ScanA, and ScanB has ended, and imaging processing data for ScanC is being indicated.

Rectangular filled marks indicating the completion of automatic starting for Scanogram, ScanA, and ScanB and indicating the automatic start processing being in progress for ScanC are being displayed, and rectangular frames indicating not yet starting for MIP and data transfer are being displayed. Thick lines displayed below the characters of Scanogram, ScanA, and ScanB each represent the progress of imaging processing.

Moreover, due to, for example, a change in situation of a subject during an examination, the need to temporarily halt the examination may arise. In the example illustrated in FIG. 9, a box 901 used to receive an instruction for "pause scan" issued from the user is also displayed, thus enabling the user to stop an examination depending on, for example, a change in situation. In the case of resuming the examination when the situation has improved, the user can designate a starting position from among the processing operations enumerated on the left end side of the screen illustrated in FIG. 9 and issue an instruction to restart the examination halfway, so that the remaining operations of the examination can be automatically performed with use of a previously generated image or images.

In the above-described way, according to the present embodiment, examination flow data defining a plurality of processing operations are previously stored and an examination is executed with data of examination flow including a desired processing operation selected according to an input instruction issued from the user, so that a serial examination including a plurality of processing operations can be automatically executed. Accordingly, it is possible to reduce a burden placed on the user who is performing an examination by a manual operation and improve the examination efficiency.

Moreover, according to the present embodiment, data of examination flow customized by the user is previously stored, so that the user is enabled to perform an examination flow with a desired condition replicated, without setting a condition related to a processing operation each time. Moreover, designating a past examination enables automatic imaging and post processing to be performed with the same examination condition as that of the past examination and with positioning or vascular extraction using the same feature point as that of the past examination performed.

What is claimed is:
1. A magnetic resonance imaging apparatus comprising:
a computer configured to perform action control of the entire apparatus and to perform computation; and
an imager, including a pulse sequencer, configured to perform imaging according to control performed by the computer,
wherein the computer includes:
a memory storage configured to store a plurality of examination flow data, each examination flow data defining imaging processing, post processing, display or transfer processing, and to store key words respectively identifying the examination flow data;
a user interface configured to receive an input instruction as a term or text for identifying an examination with an expression issued by a user for executing a desired examination according to a user selected ordering key word;
an examination flow controller configured to select the examination flow data corresponding to the input instruction, based on the user selected ordering key word, each ordering key word associating a respective plurality of processing steps of examination flow data with an input instruction, and to cause processing defined by the selected examination flow data to be automatically performed from a start of the desired examination to an end of the desired examination to perform process steps in order from the start of the desired examination to the end of the desired examination such that, in a case where no instructions for pausing the process steps are provided, following an initial processing step of the plurality of processing steps, each subsequent processing step of the plurality of processing steps follows after a preceding processing step of the plurality of processing steps in consecutive order, such that each subsequent processing step is a next step after a respective preceding step of the plurality of steps, the selected examination flow data including different scan types and scan regions, the user selected ordering key word including information, the information relating to a resolution or a time of the desired examination, the user selected ordering key word being an ordering key word made from a combination of an examination region and an examination object or time, wherein the user interface is further configured to receive information relating to a subject identifier, a subject name, a subject age and a subject weight; and an analysis controller, wherein between each of the plurality of steps, the user interface is configured to display a result and a timer, the timer configured to count down a preset waiting time, wherein during the preset waiting time the user interface is configured to receive, from the user, a manual change or adjustment to one of an imaging position, a scan condition, background signal removal, or analysis parameters based on the result, wherein the post processing steps include generating image data, and the analysis controller is configured to check whether the generated image data is data adapted for post processing data, and to perform analyzing processing with generated image data automatically when the preset waiting time lapses, wherein, when the user has halted an examination and has restarted the halted examination part way, the computer is configured to automatically perform remaining processing operations of the examination with use of a previously generated image.

2. The magnetic resonance imaging apparatus according to claim 1, wherein the user interface is configured to display a plurality of candidates for a key word corresponding to an input instruction, and the examination flow controller configured to select the examination flow data based on selection from the plurality of candidates performed by the user.

3. The magnetic resonance imaging apparatus according to claim 1, wherein the user interface is configured to display the key words and to receive selection of a key word performed by the user as an input instruction.

4. The magnetic resonance imaging apparatus according to claim 1, wherein the user interface is configured to display processing defined by the examination flow data.

5. The magnetic resonance imaging apparatus according to claim 1, wherein the user interface is configured to display processing defined by the examination flow data and further to display a degree of progress of the processing.

6. A non-transitory computer readable storage medium storing a control program for a magnetic resonance imaging apparatus including a computer configured to perform action control of the entire apparatus and to perform computation, an imager configured to perform imaging according to control performed by the computer, and a memory storage configured to store a plurality of examination flow data, each examination flow data defining a processing flow of imaging processing, post processing, and display or transfer processing and to store key words respectively identifying the examination flow data, the control program causing a computer to perform:

receiving via a user interface an input instruction as a term or text for identifying an examination with an expression issued by a user for executing a desired examination according to a user selected ordering key word; and selecting the examination flow data corresponding to the input instruction, based on the user selected ordering key word, each ordering key word associating a respective plurality of processing steps of examination flow data with an input instruction, and causing processing defined by the selected examination flow data to be automatically performed from a start of the desired examination to an end of the desired examination to perform process steps in order from the start of the desired examination to the end of the desired examination such that, in a case where no instructions for pausing the process steps are provided, following an initial processing step of the plurality of processing steps, each subsequent processing step of the plurality of processing steps follows after a preceding processing step of the plurality of processing steps in consecutive order, such that each subsequent processing step is a next step after a respective preceding step of the plurality of steps, the selected examination flow data including different scan types and scan regions, the user selected ordering key word including information, the information relating to a resolution or a time of the desired examination, the user selected ordering key word being an ordering key word made from a combination of an examination region and an examination object or time, wherein the user interface is further configured to receive information relating to a subject identifier, a subject name, a subject age and a subject weight, wherein between each of the plurality of steps, the user interface is configured to display a result and a timer, the timer configured to count down a preset waiting time, wherein during the preset waiting time the user interface is configured to receive, from the user, a manual change or adjustment to one of an imaging position, a scan condition, background signal removal, or analysis parameters based on the result, wherein the processing steps include generating image data, checking whether the generated image data is data adapted for post processing data, and performing analyzing processing with generated image data automatically when the preset waiting time lapses, wherein, when the user has halted an examination by providing an instruction to pause the examination through the user interface, and then has restarted the halted examination part way, automatically performing remaining processing operations of the examination with use of a previously generated image, wherein the user interface allows designating a starting position among the remaining processing operations.

* * * * *